(12) United States Patent
Park et al.

(10) Patent No.: US 9,048,240 B2
(45) Date of Patent: Jun. 2, 2015

(54) ANISOTROPIC CONDUCTIVE FILM AND ELECTRONIC DEVICE INCLUDING THE SAME

(71) Applicants: Young Woo Park, Uiwang-si (KR); Nam Ju Kim, Uiwang-si (KR); Kyoung Soo Park, Uiwang-si (KR); Joon Mo Seo, Uiwang-si (KR); Kyung Il Sul, Uiwang-si (KR); Dong Seon Uh, Uiwang-si (KR); Arum Yu, Uiwang-si (KR); Hyun Min Choi, Uiwang-si (KR)

(72) Inventors: Young Woo Park, Uiwang-si (KR); Nam Ju Kim, Uiwang-si (KR); Kyoung Soo Park, Uiwang-si (KR); Joon Mo Seo, Uiwang-si (KR); Kyung Il Sul, Uiwang-si (KR); Dong Seon Uh, Uiwang-si (KR); Arum Yu, Uiwang-si (KR); Hyun Min Choi, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 0 days.

(21) Appl. No.: 13/728,215

(22) Filed: Dec. 27, 2012

(65) Prior Publication Data

US 2013/0168847 A1    Jul. 4, 2013

(30) Foreign Application Priority Data

Dec. 28, 2011  (KR) ........................ 10-2011-0144748

(51) Int. Cl.
*H01B 1/00* (2006.01)
*H01L 23/48* (2006.01)
(Continued)

(52) U.S. Cl.
CPC ..... *H01L 23/538* (2013.01); *H01L 2224/29371* (2013.01); *H01L 2224/29366* (2013.01); *H01L 2224/29324* (2013.01); *H01L 2224/2939* (2013.01); *H01L 2224/29455* (2013.01); *H01L 2224/29439* (2013.01); *H01L 2224/29447* (2013.01); *H01L 24/16* (2013.01); *H01L 24/29* (2013.01); *H01L 24/32* (2013.01); *H01L 24/73* (2013.01); *H01L 2224/16225* (2013.01);
(Continued)

(58) Field of Classification Search
CPC .................... H01L 21/31155; H01L 21/3143; H01L 21/31608; H01L 21/563; H01L 21/67207; H01L 21/6835; H01L 2221/6834; H01L 2221/68354; H01L 2224/13144; H01L 2224/16; H01L 2224/274; H01L 2224/29; H01L 2224/293; H01L 2224/29324
USPC ................... 257/734; 361/783, 760; 428/328; 524/40; 529/529; 438/592
See application file for complete search history.

(56) References Cited

U.S. PATENT DOCUMENTS

| 2006/0019195 A1* | 1/2006 | Hatakeyama et al. | 430/270.1 |
| 2010/0087590 A1* | 4/2010 | Ogura et al. | 524/540 |
| 2010/0110652 A1* | 5/2010 | Takane | 361/783 |

FOREIGN PATENT DOCUMENTS

| KR | 10-2008-0097872 A | 11/2008 |
| KR | 10-0894401 B1 | 4/2009 |

(Continued)

OTHER PUBLICATIONS

Korean Office Action dated Apr. 16, 2014.
(Continued)

*Primary Examiner* — Colleen A Matthews
*Assistant Examiner* — Junaiden Mirsalahuddin
(74) *Attorney, Agent, or Firm* — Lee & Morse, P.C.

(57) ABSTRACT

An electronic device includes an anisotropic conductive film as a connection material, the anisotropic conductive film being formed from an anisotropic conductive film-forming composition. The anisotropic conductive film-forming composition includes a polycyclic aromatic ring-containing epoxy resin, a fluorene epoxy resin, nano silica and conductive particles.

18 Claims, 3 Drawing Sheets

(51) Int. Cl.
- *H01L 23/538* (2006.01)
- *C09J 9/02* (2006.01)
- *C08G 59/22* (2006.01)
- *C08G 59/24* (2006.01)
- *H01L 23/00* (2006.01)
- *C08L 63/00* (2006.01)

(52) U.S. Cl.
CPC .......... *H01L 2224/2929* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29386* (2013.01); *H01L 2224/29393* (2013.01); *H01L 2224/32225* (2013.01); *H01L 2224/73204* (2013.01); *H01L 2924/15788* (2013.01); *H01L 2224/29444* (2013.01); *C09J 9/02* (2013.01); *C08G 59/226* (2013.01); *C08G 59/245* (2013.01); *C08L 63/00* (2013.01); *H01L 2924/07811* (2013.01); *C08K 2201/001* (2013.01); *C08K 2201/011* (2013.01); *H01L 2924/07802* (2013.01)

(56) References Cited

FOREIGN PATENT DOCUMENTS

| | | | |
|---|---|---|---|
| KR | 10-2010-0020029 | A | 2/2010 |
| KR | 10-2010-0056198 | A | 5/2010 |
| KR | 10-2010-0077794 | A | 7/2010 |
| KR | 10-2011-0019519 | A | 2/2011 |

OTHER PUBLICATIONS

Chinese Office Action dated Sep. 23, 2014.
Korean Office Action dated Aug. 18, 2014.

* cited by examiner

ANISOTROPIC CONDUCTIVE FILM AND ELECTRONIC DEVICE INCLUDING THE SAME

CROSS-REFERENCE TO RELATED APPLICATION

The present application claims priority under 35 U.S.C. §119 to Korean Patent Application No. 10-2011-0144748, filed on Dec. 28, 2011, in the Korean Intellectual Property Office, and entitled: "Semiconductor Device Using Composition for Anisotropic Conductive Films or Anisotropic Conductive Film," which is incorporated by reference herein in its entirety.

BACKGROUND

1. Field

Embodiments relate to an anisotropic conductive film and an electronic device including the anisotropic conductive film.

2. Description of the Related Art

With the recent trend toward large size and slimness in display devices, pitches between electrodes and between circuits have gradually become finer. Anisotropic conductive adhesive films play an important role as interconnection mechanisms for fine circuit terminals.

Anisotropic conductive films are used as connection materials for packing LCD panels, printed circuit boards (PCBs), driver IC circuits and the like in LCD modules. A plurality of driver ICs are mounted to drive thin film transistor (TFT) patterns in an LCD module. Methods for mounting driver ICs on LCD panels include wire bonding in which driver ICs are connected to an LCD panel electrode through conductive wires, tape automated bonding (TAB) in which driver ICs are mounted on electrodes on an LCD panel using a base film, and chip-on-glass (COG) in which driver ICs are directly mounted on an LCD panel via adhesives, and the like.

SUMMARY

Embodiments are directed to an electronic device, including an anisotropic conductive film as a connection material, the anisotropic conductive film being formed from an anisotropic conductive film-forming composition, the anisotropic conductive film-forming composition including a polycyclic aromatic ring-containing epoxy resin, a fluorene epoxy resin, nano silica, and conductive particles.

The polycyclic aromatic ring-containing epoxy resin may have a glass transition temperature after curing (Tg) of about 165° C. to about 250° C.

The fluorene epoxy resin may have a boiling point of about 50 to about 80° C. and a molecular weight of about 1,000 or less.

The polycyclic aromatic ring-containing epoxy resin may include at least one selected from the group of tetra-functional aromatic ring-containing epoxy resins and bi-functional aromatic ring-containing epoxy resins.

A weight ratio of the polycyclic aromatic ring-containing epoxy resin to the nano silica may range from about 3:1 to about 6:1.

The fluorene epoxy resin may be a resin containing a glycidyl group in a bisphenol fluorene, the bisphenol fluorene being represented by Formula 1:

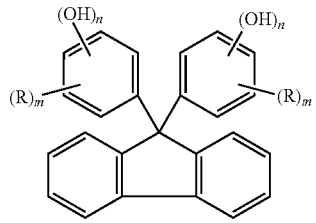

[Formula 1]

wherein each R is independently an alkyl group, an alkoxy group, an aryl group or a cycloalkyl group, each m is independently an integer from 0 to 4, and each n is independently an integer from 1 to 5.

A weight ratio of the polycyclic aromatic ring-containing epoxy resin to the fluorene epoxy resin may range from about 1:0.1 to about 1:1.5.

The anisotropic conductive film may be formed from the anisotropic conductive film-forming composition in a chip on glass (COG) mounting process.

Embodiments are also directed to an electronic device including an anisotropic conductive film as a connection material, the anisotropic conductive film being formed from an anisotropic conductive film-forming composition, the anisotropic conductive film-forming composition including a polycyclic aromatic ring-containing epoxy resin, and a fluorene epoxy resin having a boiling point of about 50 to about 80° C., wherein a weight ratio of the polycyclic aromatic ring-containing epoxy resin to the fluorene epoxy resin ranges from about 1:0.1 to about 1:1.5.

The fluorene epoxy resin may have a liquid phase at 25° C.

The polycyclic aromatic ring-containing epoxy resin may include at least one selected from the group of tetra-functional aromatic ring-containing epoxy resins and bi-functional aromatic ring-containing epoxy resins.

A weight ratio of the polycyclic aromatic ring-containing epoxy resin to the fluorene epoxy resin may range from about 1:0.14 to about 1:1.

The anisotropic conductive film-forming composition further may include nano silica. A weight ratio of the polycyclic aromatic ring-containing epoxy resin to the nano silica may range from about 3:1 to about 6:1.

The anisotropic conductive film-forming composition may provide uniform indentation after the composition is bonded.

The anisotropic conductive film-forming composition may have a preliminary pressing temperature of 60° C. or more.

Embodiments are also directed to an electronic device including, as a connection material, an anisotropic conductive film having a peel strength of 4 MPa or more as measured after pressing at 70° C. and 1 MPa for 0.5 seconds.

The anisotropic conductive film may have a preliminary pressing temperature of 60° C. or more.

The anisotropic conductive film may provide uniform indentation after the film is bonded.

The anisotropic conductive film may includes a polycyclic aromatic ring-containing epoxy resin, a fluorene epoxy resin having a boiling point of about 50 to about 80° C., and nano silica.

A weight ratio of the polycyclic aromatic ring-containing epoxy resin to the fluorene epoxy resin may range from about 1:0.1 to about 1:1.5, and a weight ratio of the polycyclic aromatic ring-containing epoxy resin to the nano silica may range from about 3:1 to about 6:1.

BRIEF DESCRIPTION OF DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 4:
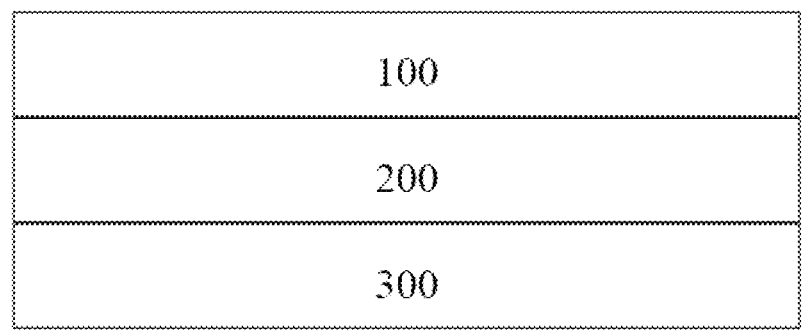
FIG. 4 schematically illustrates an electronic device including an anisotropic conductive film as a connection material.

Embodiments relate to an electronic device including an anisotropic conductive film as a connection material. For example, FIG. 4 illustrates an electronic device 100 attached to a substrate 300 by using an anisotropic film (or anisotropic conductive film-forming composition) 200 as a connection material. Any suitable electronic device 100 and substrate 300 may be used. For example, the electronic device may be semiconductor device or an IC chip and the substrate 300 may be a glass substrate including a circuit. The anisotropic conductive film may be formed from an anisotropic conductive film-forming composition. Embodiments also relate to an anisotropic conductive film formed from the anisotropic conductive film-forming composition. The anisotropic conductive film-forming composition may include a polycyclic aromatic ring-containing epoxy resin having a glass transition temperature (Tg) after curing of about 165° C. to about 250° C.; a fluorene epoxy resin having a boiling point of about 50° C. to about 80° C., a molecular weight of 1,000 or less and having a liquid phase; and nano silica.

In an implementation, a weight ratio of the polycyclic aromatic ring-containing epoxy resin to the nano silica may range from about 3:1 to about 6:1, for example, from about 3.5:1 to about 6:1. Within this range, uniform pressure may be applied to respective bumps in X, Y and Z directions, thereby improving preliminary pressing properties of the anisotropic conductive film.

The polycyclic aromatic ring-containing epoxy resin may have a high reaction speed, and may have high viscosity upon hot pressing, may maintain high heat resistance, and may exhibit excellent resistance to a pressure gradient applied to driver ICs, thereby uniformly maintaining the pressure applied to the respective bumps in the X and Y directions. However, the polycyclic aromatic ring-containing epoxy resin may have an excessively high viscosity in the Z-direction to which pressure is transferred. An area between electrodes may open due to low resin exclusion between the driver ICs and panel electrodes. When nano-scale silica is used in conjunction with the polycyclic aromatic ring-containing epoxy resin, the resin exclusion in the Z-axis direction may be increased and, as a result, pressure non-uniformity in the X-Y-Z axes may be reduced or avoided.

When the amounts of the polycyclic aromatic ring-containing epoxy resin and the nano silica are high, tack of a glass may be disadvantageously decreased. With a fluorene epoxy resin having a boiling point of about 50° C. to about 80° C., a molecular weight of 1,000 or less and a liquid phase, an anisotropic conductive film composition having improved preliminary pressing may be obtained through improvement of initial adhesion of the composition.

In an implementation, a weight ratio of the polycyclic aromatic ring-containing epoxy resin to the fluorene epoxy resin may range from about 1:0.1 to about 1:1.5, e.g., about 1:0.14 to about 1:1. If the weight ratio of the fluorene epoxy resin is more than 0.1, desired effects including improvement of initial adhesion may be obtained. If the weight ratio does not exceed 1.5, a non-uniform application of pressure in the X-Y-Z axes, which may cause deteriorating connection reliability, may be reduced or avoided.

In an implementation, the composition may be used for a mounting process, such as COG (chip on glass) or FOG (film on glass).

In an implementation, the polycyclic aromatic ring-containing epoxy resin may be present in an amount of about 10% to about 50% by weight, based on the total weight of the composition.

In an implementation, the anisotropic conductive film-forming composition may be used as an ACF layer of a double-layer anisotropic conductive film composition.

In an implementation, the anisotropic conductive film-forming composition according to embodiments may further include a phenoxy resin, conductive particles and a curing agent, in addition to the components described above. The phenoxy resin may be present in an amount of about 15% to about 25% by weight, the conductive particles may be present in an amount of about 5% to about 30% by weight, and the curing agent may be present in an amount of about 10% to about 20% by weight, based on the total weight of the composition.

In an implementation, the anisotropic conductive film-forming composition may have an initial adhesion of higher than 20 gf and less than 60 gf, for example, higher than 20 gf and less than about 50 gf, as measured via a ball tack method. The adhesive strength may be measured using a probe tack tester in accordance with the method described in examples.

The anisotropic conductive film-forming composition according to embodiments may include a fluorene epoxy resin having a boiling point of about 50° C. to about 80° C., a molecular weight of 1,000 or less and a liquid phase at room temperature. Thus, the anisotropic conductive film formed from the anisotropic film-forming composition may exhibit an initial adhesive strength higher than 20 gf and less than 60 gf and/or a peel strength of at least 4 MP or, for example, 5 MPa or more after pressing at 70° C. and 1 MPa for 0.5 seconds.

In another aspect, embodiments relate to an electronic device including an anisotropic conductive film-forming composition or an anisotropic conductive film formed from the composition, as a connection material, wherein the anisotropic conductive film-forming composition includes a polycyclic aromatic ring-containing epoxy resin and a fluorene epoxy resin having a boiling point of about 50° C. to about 80° C. The weight ratio of the polycyclic aromatic ring-containing epoxy resin to the fluorene epoxy resin may range from about 1:0.1 to about 1:1.5.

If the weight ratio of the fluorene epoxy resin is more than 0.1, desired effects including improvement of initial adhesion may be obtained. If the weight ratio is less than 1.5, non-uniform indentation after bonding due to non-uniform application of pressure in the X-Y-Z axes, which may cause deterioration in connection reliability, may be reduced or avoided.

The weight ratio of the aromatic ring-containing epoxy resin to the fluorene epoxy resin may be about 1:0.14 to about 1:1. For example, the amount of the fluorene epoxy resin may be less than or equal to the amount of the aromatic ring-containing epoxy resin.

In an embodiment, the polycyclic aromatic ring-containing epoxy resin may have a glass transition temperature (Tg) after curing from about 165° C. to about 250° C. Within this range, it may be possible to prevent or reduce the occurrence of heat transfer, which may occur at about 160° C. upon film-on-glass (FOG) pressing and may cause damage to an ACF and deterioration in reliability. Generation of workability defects may be avoided due to low ACF preliminary pressing. Also, the polycyclic aromatic ring-containing epoxy resin may have a minimum melt viscosity at 30° C. to 200° C. of 3,000 Pa·s to 10,000 Pa·s. The minimum melt viscosity may be measured by an advanced rheometric expansion system (ARES), as an example. For example, the minimum melt viscosity may be measured using a viscoelasticity meter (TA Instruments, RSA III).

As compared with a composition including only a polycyclic aromatic ring-containing epoxy resin, the composition containing the polycyclic aromatic ring-containing epoxy resin and the fluorene epoxy resin in a weight ratio of about 1:0.1 to about 1:1.5 may exhibit an increased initial adhesive strength upon preliminary pressing, thereby reducing the generation of bubbles. An anisotropic conductive film may be obtained with good connection reliability under preliminary pressing conditions of 60° C. or more. Generally, preliminary pressing may be performed at as low a temperature as possible, since an ACF composition may be partially cured upon preliminary pressing at high temperature, causing deterioration in adhesive strength upon final pressing. Further, preliminary pressing may be advantageously performed at low temperatures in terms of process controllability and the like.

The composition according to an implementation may be characterized in that indentation after bonding is uniform and connection resistance increment from initial connection resistance to connection resistance after reliability testing is 5 times or less, for example, 4 times or less, or 3.5 times or less.

Figure 2A:
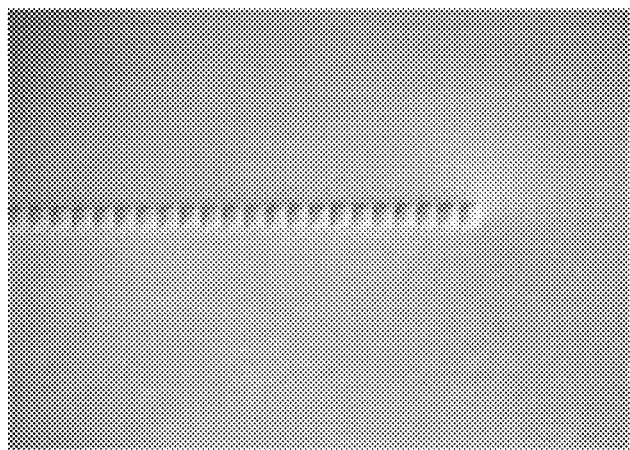
FIGS. 2A and 2B illustrate images of test samples showing good (○) indentation property and bad (x) indentation property after bonding, respectively, in one aspect.
Figure 2B:
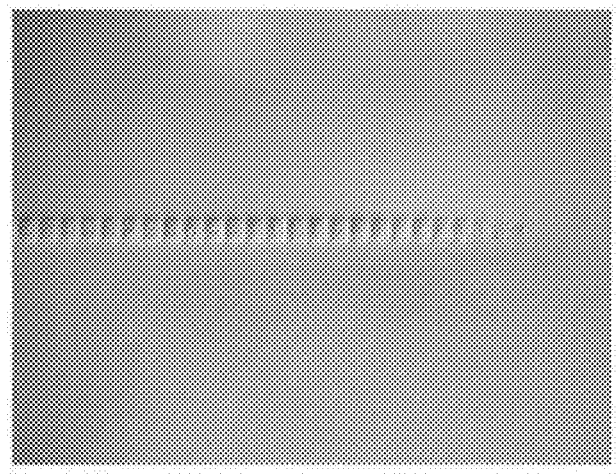

Uniformity of indentation after bonding may be determined through visual observation with the naked eye after preliminary pressing at 60° C. and 1 MPa for 1 second and final pressing at 160° C. and 3 MPa for 8 seconds. For example, as shown in FIG. 2A, when the clarity of indentation present at both sides of a driver IC is substantially similar to the clarity of indentation present at the center thereof, it may be determined that the indentation is uniform. As shown in FIG. 2B, when the indentation present at both sides of a driver IC has low clarity or is blurred as compared to the indentation present at the center thereof, it may be determined that the indentation is non-uniform.

The initial connection resistance may be measured by hot-pressing a film on glass substrate (ITO glass) at 200° C. and at 60 MPa for 5 seconds, followed by measuring electric resistance using a Hioki hi-tester of Hioki E.E. Corp. while applying an electric current of 1 mA thereto. Connection resistance after reliability testing may be evaluated based on connection resistance after exposing a sample to high temperature and high humidity environments (85° C./85%) and leaving the sample for 500 hours.

The composition may further include nano silica. In this case, the weight ratio of the polycyclic aromatic ring-containing epoxy resin to the nano silica may range from about 3:1 to about 6:1. Within this range of nano silica, the composition may exhibit low viscosity in the Z-axis direction to which pressure is transferred, thereby eliminating or reducing a possibility of opening an area between electrodes.

The fluorene epoxy resin may be a resin that contains a glycidyl group in a bisphenol fluorene, the bisphenol fluorene being represented by Formula 1:

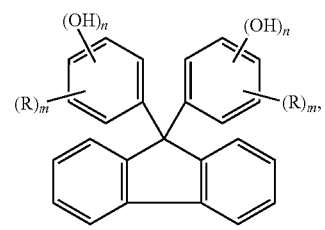

wherein each R is independently an alkyl group, an alkoxy group, an aryl group or a cycloalkyl group, each m is independently an integer from 0 to 4, and each n is independently an integer from 1 to 5. For example, a glycidyl group-containing moiety may be may be bound to an —OH group in Formula 1.

Figure 3:
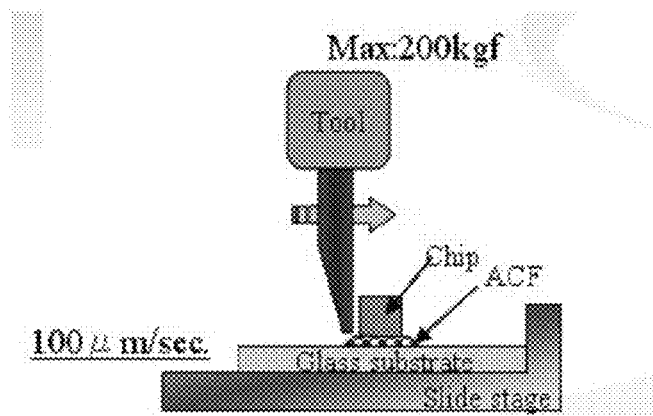
FIG. 3 illustrates a method for measuring peel strength.

In a further aspect, embodiments relate to an electronic device using, as a connection material, an anisotropic conductive film that has a peel strength of about 4 MPa or more as measured after pressing at 70° C. and 1 MPa for 0.5 seconds. Peel strength may be obtained by preliminary pressing the anisotropic conductive film under conditions of 70° C. and 1 MPa for 0.5 seconds and measuring the peel strength of the corresponding pressed portion of the film using a peel strength tester Bond tester Dage Series-4000 in an LCD Panel at maximum load of 200 kgf and a test speed of 100 um/sec, as shown in FIG. 3.

The anisotropic conductive film may have a peel strength of 4 MPa or more, e.g, about 5 to about 20 MPa. Within this range, the anisotropic conductive film may not be pushed or may not fall off upon final pressing and may allow rework in the case of incorrect pressing.

When the peel strength is within this range, initial adhesion for preliminary pressing may be secured, whereby preliminary pressing may be performed without the generation of bubbles at a preliminary pressing temperature of, for example, 60° C. or, for example, at a preliminary pressing temperature of 70° C. or more.

The anisotropic conductive film may include a polycyclic aromatic ring-containing epoxy resin, a fluorene epoxy resin having a boiling point of about 50° C. to about 80° C., and nano silica. The weight ratio of the polycyclic aromatic ring-containing epoxy resin to the fluorene epoxy resin may range from about 1:0.1 to about 1:1.5 and the weight ratio of the aromatic ring-containing epoxy resin to the nano silica may range from about 3:1 to about 6:1.

The anisotropic conductive film may exhibit uniform indentation after bonding and may have a connection resistance increment of 5 times or less, or, for example, 4 times or less, or 3.5 times or less, from initial connection resistance to connection resistance after reliability testing.

The initial connection resistance may be measured by hot-pressing an anisotropic conductive film on a glass substrate (ITO glass) at 200° C. and 60 MPa for 5 seconds and measuring an electric resistance thereof using a Hioki hi-tester of Hioki E.E. Corp., while applying an electric current of 1 mA thereto. Connection resistance after reliability testing may be evaluated based on connection resistance after exposing a sample to high temperature and high humidity environments (85° C./85%) and leaving the sample for 500 hours.

The film may be particularly useful for a mounting process such as chip on glass (COG).

Next, the respective components of the anisotropic conductive film-forming composition will be described in detail.

Polycyclic aromatic ring-containing epoxy resin

The polycyclic aromatic ring-containing epoxy resin may be a resin in which two or more aromatic rings are bonded or fused, and at least one epoxy functional group is bonded to the aromatic rings, directly or via oxygen, carbon or sulfur atoms.

The polycyclic aromatic ring-containing epoxy resin may have a glass transition temperature (Tg) after curing from about 165° C. to about 250° C. Within this range, it may be possible to prevent heat transfer, which occurs at about 160° C. upon film-on-glass (FOG) pressing and causes damage of an ACF and deterioration in reliability. The generation of workability defects may be avoided due to low ACF preliminary pressing.

The polycyclic aromatic ring-containing epoxy resin may include at least one selected from the group of tetra-functional aromatic ring-containing epoxy resins, bi-functional aromatic ring-containing epoxy resins, and combinations thereof. In an implementation, the polycyclic aromatic ring-containing epoxy resin may include at least one tetra-functional aromatic ring-containing epoxy resin.

Examples of the tetra-functional aromatic ring-containing epoxy resin may include epoxy resins containing two or more benzene rings continuously bonded or fused to each other. For example, the tetra-functional aromatic ring-containing epoxy resin may be cured from a naphthalene tetra-functional epoxy monomer having a naphthalene moiety as a rigid structure, as shown in Formula 2. For example, HP4700 (DIC Corporation) or the like may be used.

[Formula 2]

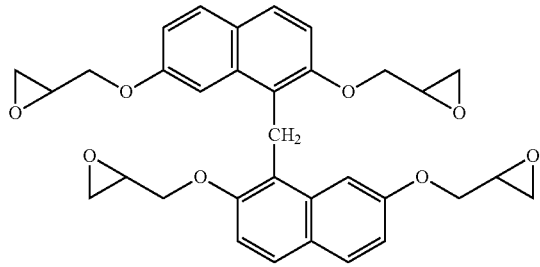

Examples of the bi-functional aromatic ring-containing epoxy resin may include epoxy resins containing two or more benzene rings continuously bonded or fused to each other. For example, the bi-functional aromatic ring-containing epoxy resin may be cured from an epoxy monomer having a structure represented by Formula 3. For example, the bi-functional aromatic ring-containing epoxy resin may be cured from an epoxy monomer selected from the group of 1,6-bis(2,3-epoxypropoxy)naphthalene, 1,5-bis(2,3-epoxypropoxy)naphthalene and 2,2'-bis(2,3-epoxypropoxy)binaphthalene.

$(Ar)_n\text{-}E_m$      [Formula 3]

wherein $(Ar)_n$ represents polycyclic aromatic hydrocarbon in which the number of benzene rings is n, E is selected from an epoxy group, a glycidyl group and a glycidyloxy group, and m is the number of E and ranges from 1 to 5. In an implementation, n may be 2 or 4, and m may be 2.

The epoxy resin including polycyclic aromatic rings may be present in an amount of about 10 to about 50% by weight, or, for example, about 20 to about 40% by weight, in the anisotropic conductive film composition. Within this range, pressure unbalance may be avoided due to strong pressure resistance upon hot pressing, and connection difficulty between driver ICs and panels may be prevented.

When the polycyclic aromatic ring-containing epoxy resin as an insulating adhesive agent is not used, the anisotropic conductive film may undergo pressure unbalance and connection failure upon heating and pressing. The polycyclic aromatic ring-containing epoxy resin has high viscosity and may maintain high heat resistance upon hot pressing, thereby imparting resistance to non-uniform pressure gradient applied to driver ICs upon hot pressing, and improving connection reliability.

Fluorene Epoxy Resin

A fluorene derivative functioning as a basic skeleton of the fluorene epoxy resin may be obtained by preparing fluorene using aryl radicals produced through reaction between an aromatic diazo-aluminum compound and copper ions (Pschorr reaction) or through Otto Paul Hermann Diels-Kurt Alder reaction between indenes and butadienes, oxidizing the fluorene in air to prepare fluorenone, and condensing the fluorenone in the presence of a phenol compound, a thiol compound such as mercaptocarboxylic acid and an aqueous hydrochloric acid solution.

The fluorene epoxy resin may be a resin that contains a glycidyl group in a bisphenol fluorene, the bisphenol fluorene being represented by Formula 1:

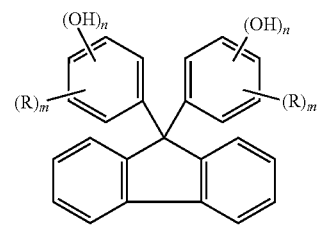

wherein each R is independently an alkyl group, an alkoxy group, an aryl group or a cycloalkyl group, each m is independently an integer from 0 to 4, and each n is independently an integer from 1 to 5. For example, a glycidyl group-containing moiety may be may be bound to an —OH group in Formula 1.

In an implementation, the fluorene epoxy resin may have a boiling point of about 50 to about 80° C. and may be in a liquid phase at room temperature. Here, the term "liquid phase" refers to being a liquid at room temperature, i.e. 25° C. When the fluorene epoxy resin has a boiling point within this range and has or is in a liquid phase at room temperature, the composition may exhibit improved initial adhesion and suppressed generation of bubbles under preliminary pressing temperature conditions (for example, at a pressing temperature of 60° C. or more).

The weight ratio of the polycyclic aromatic ring-containing epoxy resin to the fluorene epoxy resin may range from about 1:0.1 to about 1:1.5, e.g., about 1:0.14 to about 1:1. If the weight ratio of the fluorene epoxy resin is more than 0.1, desired effects including improvement of initial adhesion may be obtained. If the weight ratio is less than 1.5, pressure may be uniformly applied in the X-Y-Z axes, so that the cured film may not become excessively hard.

The fluorene epoxy resin may include at least one selected from PG-100 (BPFG, Osaka Gas Co., Ltd.), EG-210 (BPEGF, Osaka Gas Co., Ltd.), and combinations thereof, as examples.

Nano Silica

When nano silica is used together with the polycyclic aromatic ring-containing epoxy resin, it may be possible to prevent pressure unbalance in the Z direction and to reduce resin exclusion between driver ICs and panel electrodes, thereby reducing a possibility of opening an area between electrodes.

In an implementation, the nano silica may have an average particle diameter (D50) of 1 nm to 100 nm and may have a circular or spherical shape.

The nano silica may be present in an amount of about 1 to about 15% by weight, e.g., 1 to 10% by weight, based on the total weight of the anisotropic conductive film composition.

Also, the weight ratio between the polycyclic aromatic ring-containing epoxy resin to the nano silica may range from about 3:1 to about 6:1. For example, the weight ratio may range from about 3.5:1 to about 6:1. Within this range, pressure can be uniformly maintained on the respective bumps in the X, Y and Z directions, thereby improving preliminary pressing properties of the anisotropic conductive film.

Phenoxy Resin

The composition may further include a phenoxy resin.

Herein, the term "phenoxy resin" refers to a resin including a phenoxy moiety. Examples of the phenoxy resin may include bisphenol A phenoxy resins. The phenoxy resin may function as a matrix in the anisotropic conductive composition and may be composed of a resin having a low glass transition temperature. For example, the phenoxy resin may have a glass transition temperature (Tg) of about 60° C. to about 80° C.

The phenoxy resin may be present in an amount of about 15% to about 25% by weight, e.g., about 15 to about 20% by weight, based on the total weight of the anisotropic conductive film composition. Within this range, the composition may allow easy formation of films while ensuring good reliability.

Conductive Particles

The conductive particles may be metal particles, or organic or inorganic particles coated with metal such as gold or silver. Insulated conductive particles may also be used in order to secure electric insulation in excessive use.

For example, conductive particles may include metal particles including Ni, Pd, Cu, Ag, Al, Ti, Cr, Au or the like; carbon; at least one resin particle selected from polyethylene, polypropylene, polyester, polystyrene and polyvinylalcohol, and modified resin particles thereof which are coated with a metal including gold, silver, copper, nickel or the like; or particles obtained by further coating the coated particles with insulated particles.

The conductive particles may have a size ranging from about 2 μm to about 50 μm according to applications based on pitches of applied circuits. In an implementation, the conductive particles may have a size ranging from about 2 μm to about 30 μm, or, for example, from about 2 μm to about 6 μm.

The conductive particles may be present in an amount of about 5% to about 30% by weight, for example, about 10 to about 25% by weight or about 15 to about 20% by weight, based on the total weight of the anisotropic conductive film composition. Within this range, connection reliability is excellent and occurrence of a short circuit may be reduced or prevented.

Curing Agent

Any suitable curing agent may be used to cure the polycyclic aromatic ring-containing epoxy resin to form an anisotropic conductive film. The curing agent may be a potential curing agent, as an example. For example, the curing agent may be selected from the group of imidazoles, isocyanates, amines, phenols, acid anhydrides, and combinations thereof, without being limited thereto.

The curing agent may be present in an amount of about 10% to about 20% by weight, e.g., about 13 to about 20% by weight, based on the total weight of the anisotropic conductive film composition. Within this range, sufficient curing and excellent compatibility can be ensured.

The anisotropic conductive film-forming composition may further include other additives such as polymerization inhibitors, antioxidants, heat stabilizers, curing accelerators, and coupling agents to obtain additional physical properties. The additives may be added in suitable amounts.

The anisotropic conductive film may be produced by coating an anisotropic conductive film composition, which contains the polycyclic aromatic ring-containing epoxy resin, the fluorene epoxy resin, the phenoxy resin, nano silica, the curing agent, conductive particles, and the solvent, on a release film, followed by drying. The solvent facilitates production of the film by uniformly mixing the polycyclic aromatic ring-containing epoxy resin, the phenoxy resin, the fluorene epoxy resin, nano silica, the curing agent, and the conductive particles to reduce viscosity of the composition.

EXAMPLES

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

Example 1

Production of Anisotropic Conductive Adhesive Film (1) Production of Anisotropic Conductive Adhesive Layer 35% by weight of a tetra-functional polycyclic aromatic ring-containing epoxy resin (HP4700, DIC Corp., glass transition temperature after curing: 245° C.), 20% by weight of a phenoxy resin (PKHH, Inchemrez Corp.) as a binder resin serving as a matrix in the formation of a film, 5% by weight of a fluorene epoxy resin (product name: EG200, OSAKA GAS), nano silica (R972, particle diameter 7 nm, Degussa), 15% by weight of conductive particles (AUL-704, average particle diameter D50: 4 μm, Sekisui Chemical Co., Ltd.), 15% by weight of a curing agent (HX3941HP, Asahi Kasei Corp.), and 100 parts by weight of PGMEA as a solvent were mixed to form an anisotropic conductive adhesive layer having a thickness of 8 μm.

(2) Production of Non-Conductive Adhesive Layer

A non-conductive adhesive layer having a thickness of 10 μm was formed in the same manner as in (1), except that the conductive particles were not used.

(3) Production of Anisotropic Conductive Adhesive Film

The anisotropic conductive adhesive film can be easily produced using the anisotropic conductive adhesive composition without using any specific apparatus or equipment.

The anisotropic conductive adhesive layer and the non-conductive adhesive layer were adhered to each other at 40° C. and 0.2 MPa by a laminating process to produce a double-layer anisotropic conductive film (ACF: thickness of 8 μm, NCF: thickness of 10 μm), in which the anisotropic conductive film was laminated on the non-conductive film.

Example 2

The anisotropic conductive adhesive film was produced in the same manner as in Example 1 except that the tetra-functional aromatic ring-containing epoxy resin was added in an amount of 30% by weight and the fluorene epoxy resin was added in an amount of 10% by weight.

Example 3

The anisotropic conductive adhesive film was produced in the same manner as in Example 1 except that the tetra-functional aromatic ring-containing epoxy resin was added in an amount of 20% by weight and the fluorene epoxy resin was added in an amount of 20% by weight.

Comparative Example 1

The anisotropic conductive adhesive film was produced in the same manner as in Example 1 except that the tetra-functional aromatic ring-containing epoxy resin was added in an amount of 40% by weight and the fluorene epoxy resin was not added.

Comparative Example 2

The anisotropic conductive adhesive film was produced in the same manner as in Comparative Example 1 except that the tetra-functional aromatic ring-containing epoxy resin was added in an amount of 20% by weight and 20% by weight of a di-functional aromatic ring-containing epoxy resin (HP4032D, DIC) was further added.

Comparative Example 3

The anisotropic conductive adhesive film was produced in the same manner as in Example 1 except that the tetra-functional aromatic ring-containing epoxy resin was added in an amount of 15% by weight and the fluorene epoxy resin was added in an amount of 25% by weight.

Comparative Example 4

The anisotropic conductive adhesive film was produced in the same manner as in Comparative Example 3 except that the phenoxy resin was added in an amount of 25% by weight, the tetra-functional aromatic ring-containing epoxy resin was added in an amount of 20% by weight, and nano silica was not added.

TABLE 1

(Unit: % by weight)

| | Example 1 | Example 2 | Example 3 | Comparative Example 1 | Comparative Example 2 | Comparative Example 3 | Comparative Example 4 |
|---|---|---|---|---|---|---|---|
| Phenoxy resin | 20 | 20 | 20 | 20 | 20 | 20 | 25 |
| Nano silica | 10 | 10 | 10 | 10 | 10 | 10 | 0 |
| Polycyclic aromatic ring-containing epoxy resin (tetra-functional) | 35 | 30 | 20 | 40 | 20 | 15 | 20 |
| Polycyclic aromatic ring-containing epoxy resin (bi-functional) | 0 | 0 | 0 | 0 | 20 | 0 | 0 |
| Liquid epoxy resin having fluorene skeleton | 5 | 10 | 20 | 0 | 0 | 25 | 25 |
| Conductive particles | 15 | 15 | 15 | 15 | 15 | 15 | 15 |
| Curing agent | 15 | 15 | 15 | 15 | 15 | 15 | 15 |
| Total | 100 | 100 | 100 | 100 | 100 | 100 | 100 |

Phenoxy resin: PKHH (Inchemrez Corp., USA)
Nano silica: R972, particle diameter of 7 nm (Degussa)
Polycyclic aromatic ring-containing epoxy resin (tetra-functional): HP4700 (DIC Corp.), glass transition temperature: 245° C.
Polycyclic aromatic ring-containing epoxy resin (bi-functional): HP4032D (DIC Corp.)
Liquid epoxy resin having fluorene skeleton: product name: EG200 (Osaka Gas Co., Ltd.)
Conductive particles: AUL-704 (Sekisui Chemical Co., Ltd., Japan), average particle diameter (D50): 4 μm
Curing agent: HX3941HP, microcapsule-type (Asahi Kasei Corp.)
Solvent: xylene
Experimental Example: Measurement of adhesive strength, preliminary pressing properties, indentation uniformity after bonding, connection resistance, and peel strength Adhesive strength, preliminary pressing properties, indentation uniformity after bonding, connection resistance and peel strength of anisotropic conductive adhesive films produced in the examples and the comparative examples were measured as follows:

Method for Measuring Physical Properties (1) Adhesive Strength (Ball Tack)

Adhesive strength was measured using a probe tack tester (model name: TopTack 2000A, serial number: CLTT02030305A, Force Accuracy: 0.025%, Speed Range: 0.0001 to 15 mm/sec, Power Requirements: 220 to 240V (AC), 50 Hz±15%, 115V 60 Hz), and ball tack was measured in accordance with apparatus setup, sample preparation and test conditions as follows:

1. Setup of apparatus

1) Load cells, a motor and a power cable connected to an apparatus body were connected to an interface.

2) A power cord present in the apparatus body was connected to a socket and a switch on the rear side of the apparatus was turned on.

3) A temperature of a sample plate was set to 30° C.

4) A computer was turned on and a tack program was executed.

5) Initial calibration of the program was performed. Calibration was performed using a weight of 500 g.

Auto-rescaling operation was performed in the absence of a sample (initialization)

2. Measurement 2-1. Preparation of samples

1) Samples to be measured were prepared (frozen samples were left at room temperature for 1 hour or longer)

2) Upper and lower load cells were washed with MEK (methylethylketone) and dried for about 3 minutes (it was noted that a load was not higher than 200 gf)

3) A double-sided tape having a suitable size was attached to a sample stage of a measurement apparatus and the samples were attached thereto.

4) An ACF cover film was peeled off using a pair of tweezers.

2-2. Setting test conditions

1) Pressing force: 200 gf
2) Separation speed: 0.08 mm/sec
3) Dwell time: 20 sec
4) Operating temp.: 30° C.
5) Load cell: 1.0 kg
6) Probe jig size: ⅜ inch (2) Preliminary pressing properties In order to evaluate preliminary pressing properties of the anisotropic conductive adhesive films, an IC chip having a bump area of 1,430 μm² (LSI division, Samsung) and a glass substrate including a 5,000 Å thick indium tin oxide circuit (Neoview Kolon) were used as adherends.

Each of the prepared anisotropic conductive adhesive films was placed on the glass substrate and then subjected to preliminarily pressing at 40° C., 50° C., 60° C., 70° C. and about 80° C. for one second at 1 MPa. After preliminary pressing, the release film was removed and generation of bubbles between the terminals was observed using a microscope (Olympus Co., Ltd.). A very good image (○), a good image (Δ), and a bad image (x) were determined according to the ratio of the bubbling area to the pressed portion. For each type of prepared anisotropic conductive adhesive film, three samples were tested at each preliminary pressing temperature.

Figure 1A:
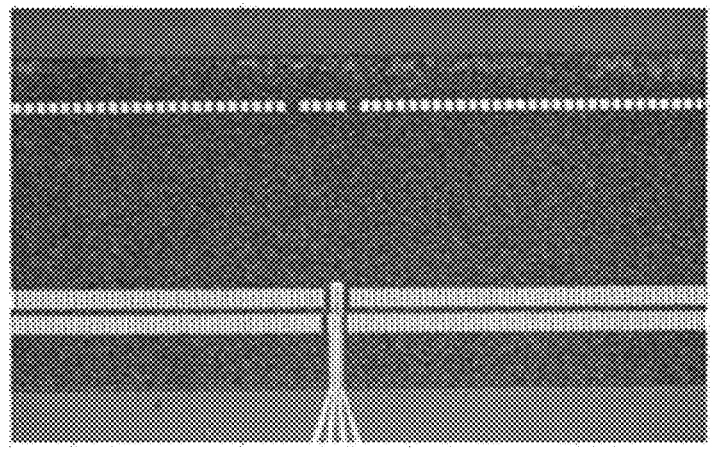
FIGS. 1A, 1B and 1C illustrate images of test samples showing very good (○), good (Δ) and bad (x) preliminary pressing properties, respectively, in which it was determined that preliminary pressing could be allowed when the number of X was zero and the number of ○ was at least one upon measurement three times.
Figure 1B:
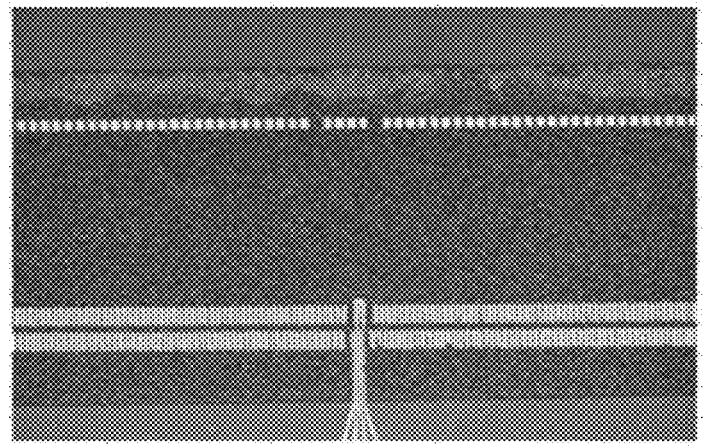
Figure 1C:
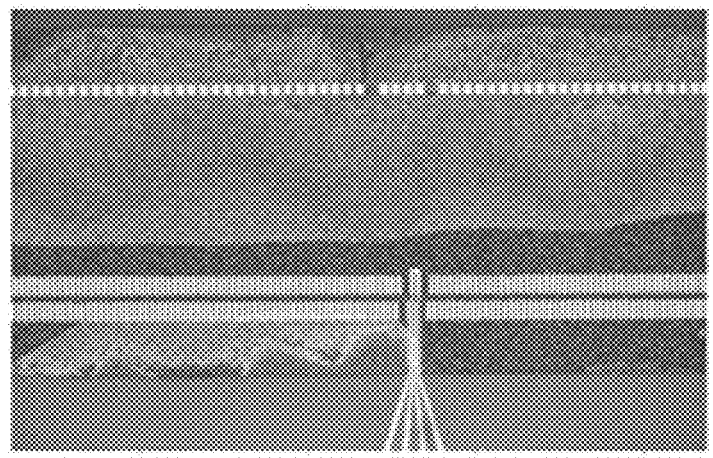

FIGS. 1A, 1B and 1C illustrate examples in which the evaluation results as to bubble generation were very good (○), good (Δ) and bad (X), respectively. It was determined that an anisotropic conductive adhesive film had satisfactory preliminary pressing properties at a specific temperature when the number of bad samples (X) out of the three tested samples was zero and the number of very good samples (○) out of the three tested samples was at least one.

(3) Indentation Uniformity after Bonding

After preliminary pressing, the release film was removed from the adhesive film and the driver IC was replaced, followed by final pressing at 160° C. and 3 MPa for 8 seconds. Indentation uniformity was determined through visual observation with the naked eye. Specifically, when clarity of indentation present at both sides of the driver IC was substantially similar to that of indentation present at the center thereof as illustrated in FIG. 2A, it was determined that indentation was uniform. When the indentation present at both sides of the driver IC had low clarity or was blurred as compared to the indentation present at the center thereof, as illustrated in FIG. 2B, it was determined that indentation was non-uniform.

(4) Peel Strength

Peel strength was measured at a corresponding pressed portion in an LCD Panel using a peel strength tester Bond tester Dage Series-4000 under conditions of a maximum load of 200 kgf and a test speed of 100 μm/sec, as shown in FIG. 3, after preliminary pressing by the method described in (2) except that the preliminary pressing conditions were 70° C. and 1 MPa and 0.5 seconds.

(5) Connection Resistance (Initial Resistance and Resistance After Reliability Testing)

An IC chip having a bump area of 1,430 μm² (Samsung LSI) and a glass substrate including a 5,000 Å indium tin oxide circuit (Neoview Kolon) were used as adherends. Each of the prepared films was disposed between the respective adherends and hot-pressed at 200° C. and 60 MPa for 5 seconds to produce a sample. Electric resistance of the sample was measured using a Hioki hi-tester produced by Hioki E.E. Corp., while applying an electric current of 1 mA. Reliability test results were obtained by measuring connection resistance after exposing the sample to high temperature and high humidity (85° C./85%) and leaving the sample for 500 hours.

The results of measured physical properties are shown in Table 2 below.

TABLE 2

|  | Example 1 | Example 2 | Example 3 | Comparative Example 1 | Comparative Example 2 | Comparative Example 3 | Comparative Example 4 |
| --- | --- | --- | --- | --- | --- | --- | --- |
| Adhesive strength (Ball Tack) | 25 | 36 | 48 | 0 | 3 | 7 | 20 |
| Preliminary pressing properties 40° C. | ○ΔX | ○ΔΔ | ○XX | XXX | XXX | XXX | XXX |
| 50° C. | ○ΔΔ | ○○○ | XXΔ | XXX | XXX | XXX | XXX |
| 60° C. | ○○○ | ○○○ | ○ΔΔ | XXX | XXX | XXX | XXΔ |
| 70° C. | ○○○ | ○○○ | ○○○ | XXX | XXX | XXX | ○ΔΔ |
| 80° C. | ○○○ | ○○○ | ○○○ | XXX | XXX | XXX | ○○○ |
| Indentation uniformity after bonding ○: Very Good, Δ: Good, X: Bad | ○○○ | ○○○ | ○○○ | ○○○ | ○○○ | ○○○ | ○ΔΔ |
| Preliminary pressing peel strength [MPa] | 6 | 5 | 6 | 2 | 3 | 2 | 2 |
| Initial connection resistance Ω [<1 Ω] | 0.44 | 0.46 | 0.43 | 0.45 | 0.47 | 0.48 | 0.58 |
| 500 Hr connection resistance Ω [<5 Ω] | 1.25 | 1.32 | 1.33 | 1.24 | 1.38 | 1.48 | 2.37 |

As can be seen from Table 2, the anisotropic conductive adhesive compositions for films according to the examples exhibited very good indentation uniformity after bonding and improved preliminary pressing properties, and exhibited good adhesion and less generation of bubbles under preliminary pressing conditions at 60° C. or more.

In addition, the anisotropic conductive films according to Examples exhibited a high peel strength of 4 MPa or more, exhibited excellent adhesion to adherends, and had small increment in connection resistance and excellent connection reliability even after reliability testing.

As such, the electronic device including, as a connection material, the anisotropic conductive film-forming composition or the film including the composition according to embodiments may exhibit improved preliminary pressing properties and uniform indentation after bonding, by allowing pressure to be uniformly transferred to respective bumps during bonding.

In addition, the electronic device including the anisotropic conductive film as a connection material may exhibit improved preliminary pressing properties, thereby exhibiting good adhesion under preliminary pressing conditions at 60° C. or more while reducing generation of bubbles.

Further, the electronic device including the anisotropic conductive film as a connection material may exhibit low increment of connection resistance after reliability testing, thereby providing high connection reliability.

By way of summation and review, anisotropic conductive films have attracted much attention as connection materials for chip-on-glass (COG) mounting of driver ICs on LCD panels. Anisotropic films may be used for electrically connecting wire patterns formed on a polyimide substrate to indium tin oxide (ITO) patterns or leads of electric components designed on a glass substrate of an LCD.

Generally, hundreds of bumps of driver ICs may be non-uniformly distributed. Specifically, a bump size of an input unit may be large and a bump size of an output unit may be small. Also, bumps may not be present at both sides of driver ICs, or, if any, the number of bumps on a reverse side may be small. Hundreds of bumps may be arranged in a single row, two rows or three rows in the output unit, and may be randomly arranged at a certain portion. Accordingly, pressure may not be evenly transferred to respective bumps when applied thereto from above for attachment of an anisotropic conductive film.

Conventional anisotropic conductive films containing a bisphenol A-type (BPA) epoxy resin or a bisphenol F-type (BPF) epoxy resin and a phenoxy resin as main components may exhibit low viscosity during curing. Thus, the conventional anisotropic conductive films may have low resistance to pressure applied during pressing, excessively high resin overflow and low reaction speed, thereby directly receiving non-uniform pressure, which is applied to driver ICs upon hot pressing. As a result, the respective bumps may be pressed in different degrees, thereby causing differences in connection resistance and deterioration in connection reliability.

To improve pressure uniformity, bumps of driver ICs may be uniformly arranged, and in particular, bumps, not related to connection, may be arranged at both sides of the driver ICs. However, in view of the recent trend of technology development, the thickness and size of driver ICs have been gradually decreased due to a decrease in active area and dead space of display products. Thus, an improvement in physical properties of adhesive films is desirable.

Conventional technologies associated with compositions for anisotropic conductive films do not disclose improvement of preliminary pressing properties, and are not directed to solving a problem of non-uniform pressure transfer during attachment of an anisotropic conductive film.

In contrast, embodiments may provide an electronic device using, as a connection material, an anisotropic conductive film-forming composition or an anisotropic conductive film including the composition, which may permit pressure to be uniformly transferred to respective bumps upon attachment of an anisotropic conductive film, thereby improving preliminary pressing properties.

Embodiments may also provide an electronic device using, as a connection material, an anisotropic conductive film-forming composition or an anisotropic conductive film including the composition, which may improve preliminary pressing properties of anisotropic conductive films to provide good adhesion under preliminary pressing conditions of 60° C. or more, thereby reducing generation of bubbles and ensuring uniform indentation after bonding.

Embodiments may also provide an electronic device using, as a connection material, an anisotropic conductive film, which exhibits a low increment rate of connection resistance after reliability testing, thereby improving connection reliability.

More particularly, embodiments relate to an electronic device, as a connection material, using an anisotropic conductive film-forming composition or an anisotropic conductive film including the composition, wherein the anisotropic conductive film-forming composition includes a polycyclic aromatic ring-containing epoxy resin, a fluorene epoxy resin, and nano silica to improve preliminary pressing properties.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope as set forth in the following claims.

What is claimed is:

1. An electronic device, comprising:
an anisotropic conductive film as a connection material, the anisotropic conductive film being formed from an anisotropic conductive film-forming composition, the anisotropic conductive film-forming composition including:
a polycyclic aromatic ring-containing epoxy resin;
a fluorene epoxy resin;
nano silica; and
conductive particles;
wherein the fluorine epoxy resin has a boiling point of about 50 to about 80° C.

2. The electronic device as claimed in claim 1, wherein the polycyclic aromatic ring-containing epoxy resin has a glass transition temperature after curing (Tg) of about 165° C. to about 250° C.

3. The electronic device as claimed in claim 1, wherein the fluorine epoxy resin has a molecular weight of about 1,000 or less.

4. The electronic device as claimed in claim 1, wherein the polycyclic aromatic ring-containing epoxy resin includes at least one selected from the group of tetra-functional aromatic ring-containing epoxy resins and bi-functional aromatic ring-containing epoxy resins.

5. The electronic device as claimed in claim 1, wherein a weight ratio of the polycyclic aromatic ring-containing epoxy resin to the nano silica ranges from about 3:1 to about 6:1.

6. The electronic device as claimed in claim 1, wherein the fluorene epoxy resin is a resin containing a glycidyl group in a bisphenol fluorene, the bisphenol fluorene being represented by Formula I:

[Formula 1]

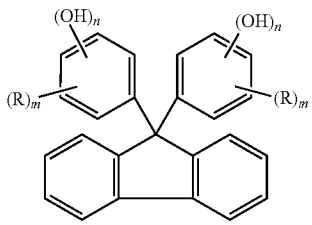

wherein each R is independently an alkyl group, an alkoxy group, an aryl group or a cycloalkyl group, each m is independently an integer from 0 to 4, and each n is independently an integer from 1 to 5.

7. The electronic device as claimed in claim 1, wherein a weight ratio of the polycyclic aromatic ring-containing epoxy resin to the fluorene epoxy resin ranges from about 1:0.1 to about 1:1.5.

8. The electronic device as claimed in claim 1, wherein the anisotropic conductive film is formed from the anisotropic conductive film-forming composition in a chip on glass (COG) mounting process.

9. An electronic device, comprising an anisotropic conductive film as a connection material, the anisotropic conductive film being formed from an anisotropic conductive film-forming composition, the anisotropic conductive film-forming composition including:
   a polycyclic aromatic ring-containing epoxy resin; and
   a fluorene epoxy resin having a boiling point of about 50 to about 80° C.,
   wherein a weight ratio of the polycyclic aromatic ring-containing epoxy resin to the fluorene epoxy resin ranges from about 1:0.1 to about 1:1.5.

10. The electronic device as claimed in claim 9, wherein the fluorene epoxy resin has a liquid phase at 25° C.

11. The electronic device as claimed in claim 9, wherein the polycyclic aromatic ring-containing epoxy resin includes at least one selected from the group of tetra-functional aromatic ring-containing epoxy resins and bi-functional aromatic ring-containing epoxy resins.

12. The electronic device as claimed in claim 9, wherein a weight ratio of the polycyclic aromatic ring-containing epoxy resin to the fluorene epoxy resin ranges from about 1:0.14 to about 1:1.

13. The electronic device as claimed in claim 9, wherein:
   the anisotropic conductive film-forming composition further includes nano silica, and
   a weight ratio of the polycyclic aromatic ring-containing epoxy resin to the nano silica ranges from about 3:1 to about 6:1.

14. The electronic device as claimed in claim 9, wherein the anisotropic conductive film provides uniform indentation after the film is bonded.

15. The electronic device as claimed in claim 14, wherein the anisotropic conductive film has a preliminary pressing temperature of 60° C. or more.

16. The electronic device as claimed in claim 1, wherein the anisotropic conductive film has a peel strength of about 4 MPa or more as measured after pressing at 70° C. and 1 MPa for 0.5 seconds.

17. The electronic device as claimed in claim 16, wherein the anisotropic conductive film has a preliminary pressing temperature of 60° C. or more.

18. The electronic device as claimed in claim 16, wherein the anisotropic conductive film provides uniform indentation after the film is bonded.

* * * * *